(12) United States Patent
Nguyen

(10) Patent No.: US 7,750,694 B1
(45) Date of Patent: Jul. 6, 2010

(54) POWER ON RESET CIRCUITRY FOR MANUFACTURABILITY AND SECURITY USING A FUSE

(75) Inventor: Andy Nguyen, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 12/269,019

(22) Filed: Nov. 11, 2008

(51) Int. Cl.
*H03L 7/00* (2006.01)
(52) U.S. Cl. .................. 327/143; 327/142
(58) Field of Classification Search ............ 327/142, 327/143, 198
See application file for complete search history.

(56) References Cited

U.S. PATENT DOCUMENTS

| | | | | |
|---|---|---|---|---|
| 5,831,460 | A * | 11/1998 | Zhou | 327/143 |
| 5,844,429 | A * | 12/1998 | Cho | 327/68 |
| 6,188,257 | B1 * | 2/2001 | Buer | 327/143 |
| 6,281,723 | B1 * | 8/2001 | Tailliet | 327/143 |
| 6,400,196 | B1 * | 6/2002 | Aoki et al. | 327/143 |
| 6,400,202 | B1 * | 6/2002 | Fifield et al. | 327/291 |
| 6,784,704 | B2 * | 8/2004 | Sato | 327/143 |
| 7,365,387 | B2 * | 4/2008 | Benjamin | 257/320 |
| 2001/0048328 | A1 * | 12/2001 | Sato | 327/143 |
| 2004/0135609 | A1 * | 7/2004 | Horbelt | 327/198 |

* cited by examiner

*Primary Examiner*—Lincoln Donovan
*Assistant Examiner*—Adam D Houston
(74) *Attorney, Agent, or Firm*—Martine Penilla & Gencarella, LLP

(57) ABSTRACT

Circuits and methods for controlling a Power On Reset (POR) circuit in an Integrated Circuit (IC) are presented. In one embodiment, a circuit includes a fuse, test POR override circuitry, and latch enable circuitry. The test POR override circuitry is in electrical communication with the fuse and includes a latch. The output of the test POR override circuitry is selectable between a test POR signal and a first logic value based on the output of the latch. The latch enable circuitry, in communication with the test POR override circuitry, is configured to enable the loading of the latch with the first logic value when the fuse has been programmed and with a second logic value otherwise. In addition, the output of the test POR override circuitry and the output of the POR circuit are gated to generate a POR signal. Where the test POR override circuitry is enabled before the fuse is programmed to allow the testing of the IC during manufacturing. Once the fuse is programmed, the test POR override circuitry is disabled to protect the IC from outside access to the SRAM configuration using the test POR override circuitry.

18 Claims, 8 Drawing Sheets

POWER ON RESET CIRCUITRY FOR MANUFACTURABILITY AND SECURITY USING A FUSE

BACKGROUND

The present invention relates to circuits and methods for controlling the Power On Reset (POR) sequence in an Integrated Circuit (IC), and more particularly, circuits and methods for controlling an external test POR signal used for testing the IC.

Programmable devices contain millions of Static Random Access Memory (SRAM) cells holding the configuration of the programmable device. During power up, all the SRAM cells need to be reset into a known state. The reset of the SRAM cells is typically performed by a POR signal generated by a POR circuit. The POR signal is active during the POR phase of the initialization stage of the IC, and before the configuration stage where the user information is loaded into the SRAM cells. The POR signal is also used to configure the I/O circuitry of the IC, as well as to eliminate conflicts in the IC that may draw unsustainable, or even damaging, current from the power supply.

Some devices include a test POR input pin used for testing how changes in the power supply affect the performance of the IC. Typically, the POR signal is generated during power up, or when the power supply goes below a certain threshold voltage that forces the IC to go thorough a new POR sequence. In order to test the response of the IC to fluctuations in power supply, the test POR input overrides the POR signal to avoid the initialization of a new POR sequence when the voltage level falls below the threshold voltage.

While the test POR input helps in the testing and debugging of the IC, the test POR signal can also be used to read the contents of the SRAM cells by lowering the power supply and using the test POR input to avoid resetting the device. This potentially enables the cloning of the IC by someone without the original configuration that uses the test POR input to read the SRAM cells. Once the configuration of the IC is obtained, another device can be programmed with the same configuration to clone the original device.

It is in this context that embodiments of the invention arise.

SUMMARY

Embodiments of the present invention provide circuits and methods for controlling a Power On Reset (POR) circuit in an Integrated Circuit (IC). A programmable fuse is used to disable an external test POR input, typically after testing on the IC is completed. This assures that POR circuits in the IC are always enabled while the IC is operating.

It should be appreciated that the present invention can be implemented in numerous ways, such as a process, an apparatus, a system, a device or a method on a computer readable medium. Several inventive embodiments of the present invention are described below.

In one embodiment, a circuit for controlling a POR circuit in an IC includes a fuse, test POR override circuitry, and latch enable circuitry. The test POR override circuitry is connected to the fuse and includes a latch. The output of the test POR override circuitry is selectable between a test POR signal and a first logic value based on the output of the latch. In one embodiment, the latch includes two inverters connected in opposite directions between the input and output of the latch. The latch enable circuitry connected to the POR override circuitry enables the loading of the latch with the first logic value when the fuse has been programmed, and with a second logic value otherwise. The output of the test POR override circuitry and the output of the POR circuit are gated to generate a POR signal. In another embodiment, a method implements the functionality of the circuit.

In yet another embodiment, the circuit includes a fuse, test POR override circuitry in electrical communication with the fuse, and a logic gate. The output of the test POR override circuitry is selectable between a test POR signal and a first logic value based on the programming of the fuse. The logic gate has the output of the test POR override circuitry and the output from the POR circuit as inputs, and the POR signal as output.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe circuits and methods for controlling a Power On Reset (POR) circuit in an Integrated Circuit (IC). In one embodiment, the circuit that controls the POR circuit includes a fuse, test POR override circuitry, and latch enable circuitry. The test POR override circuitry is in electrical communication with the fuse and includes a latch. The output of the test POR override circuitry is selectable between a test POR signal and a first logic value based on the output of the latch. The latch enable circuitry, in communication with the test POR override circuitry, is configured to enable the loading of the latch with the first logic value when the fuse has been programmed and with a second logic value otherwise. In addition, the output of the test POR override circuitry and the output of the POR circuit are gated to generate a POR signal. In one embodiment, the fuse is a one time programmable fuse, where the test POR override circuitry is enabled before the fuse is programmed to allow the testing of the IC during manufacturing. Once the fuse is programmed, the test POR override circuitry is disabled to protect the IC from outside access to the SRAM configuration using the test POR override circuitry. In another embodiment, the fuse is a resettable fuse, and once the resettable fuse is programmed, the test POR override circuitry is disabled until the fuse is reset.

It will be obvious, however, to one skilled in the art, that the present invention may be practiced without some or all of these specific details. In other instances, well known process operations have not been described in detail in order not to unnecessarily obscure the present invention.

Figure 1:
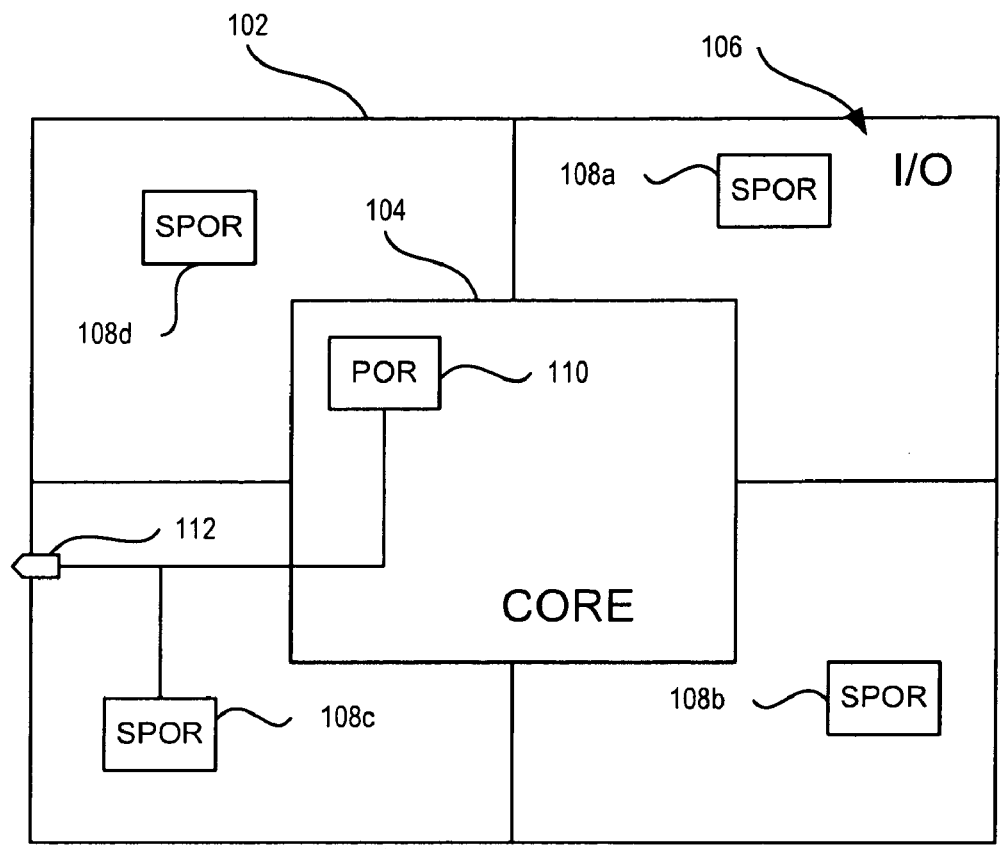
FIG. 1 shows a high level architecture of an IC including POR circuits.

FIG. 1 shows a high level architecture of IC 102 including POR circuits. IC 102 includes core area 104 and Input/Output (I/O) area 106, which is divided in four different blocks. While IC 102 has four different I/O areas in the IC of FIG. 1, other configurations are possible with different number of I/O blocks, such as 1, 2, 8, etc. POR 110 and SPOR (Satellite POR) 108a-d circuits are different types of Power-on Reset detection circuits used to monitor power supplies. In one embodiment, POR circuits monitor Vcc, while SPOR circuits monitor VCCN1 and VCCN2, two different power supplies used by the I/O subsystem. For simplicity, only a few POR circuits are shown in IC 102, but multiple POR circuits can be distributed along the core and the I/O ring to monitor different power supplies, different blocks in the IC, and different circuits.

POR circuit 110 can be one of a variety of different types of POR circuits, or a combination of POR circuits, such as VTPOR (VT POR, where VT is the transistor threshold voltage) and BGPOR (BandGap POR). In one embodiment, pin 112 is used to control the operation of POR circuits (see for example TEST_POR 202 described below with respect to FIG. 2). It should be appreciated that FIG. 1 is an exemplary diagram for illustrating distribution of POR circuits on an IC, and is not meant to be limiting.

Figure 2:
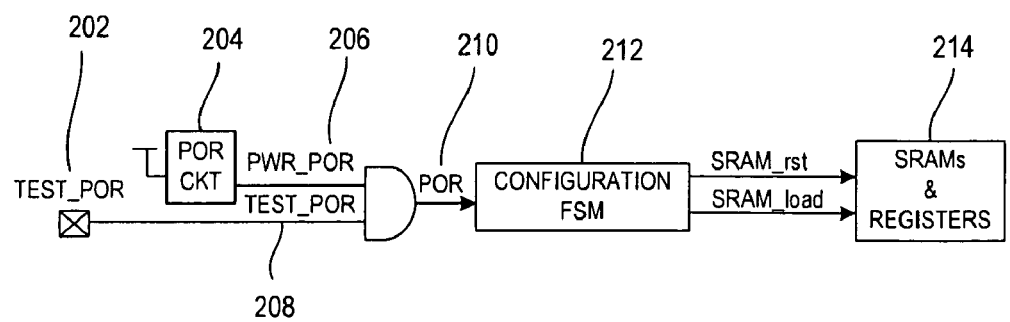
FIG. 2 shows one embodiment for overriding a POR signal with a test POR input.

FIG. 2 shows one embodiment for overriding a POR signal with a test POR input. POR circuit 204 generates PWR_POR pulse 206 during the POR sequence of the IC, either because the IC has been just powered up or because the power supply in the IC drifted below a threshold level that caused a new POR signal. In one embodiment, test POR (TEST_POR) signal 208 is obtained from pin 202 in the IC, and in another embodiment, TEST_POR signal 208 is obtained from a signal originating in another circuit of the IC.

PWR_POR 206 and TEST_POR 208 are connected to an AND gate that outputs POR signal 210. POR signal 210 is connected to Configuration Finite State Machine (FSM) 212 that controls the configuration phase of the IC and produces signals SRAM_rst and SRAM_load to reset and load, respectively, SRAM cells and registers 214.

During normal operation of the IC, TEST_POR 208 has a logic high value, and POR will be equal to PWR_POR. However, if TEST_POR input 202 obtains a logic low value, then POR signal 210 will have a logic low value, independent of the PWR_POR value. In other words, if TEST_POR input 202 has a logical low value, then the IC will not restart a new POR sequence if the power supply goes below a threshold level. TEST_POR input 202 is used to test the performance of the IC, by disabling the POR pulse PWR_POR 206 and then analyzing IC performance according to variations in the power supply. On the other hand, a malicious user could potentially use TEST_POR input 202 to override the POR signal and obtain unauthorized access to SRAM cells 214. Once the SRAM cells are read, the malicious user could clone the IC by reusing the configuration of the SRAM cells.

In applications where security is a concern, ICs do not include a TEST_POR input to avoid malicious use. However, the missing TEST_POR input translates to a more complex and lengthy testing of the device during manufacturing, and the inability to perform certain tests that use the TEST_POR pin.

Figure 3:
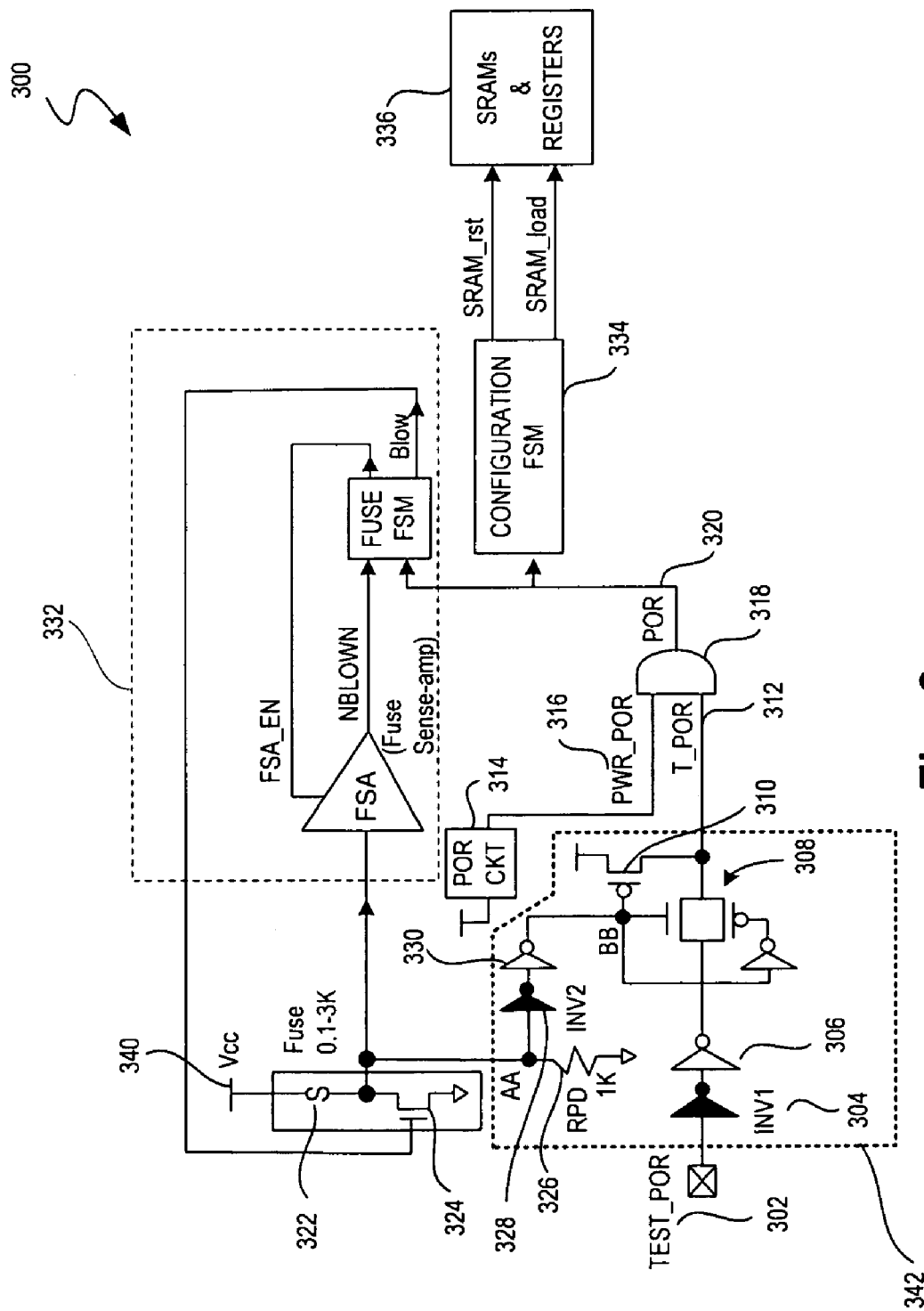
FIG. 3 depicts a circuit for controlling a test POR input using a fuse according to one embodiment.

FIG. 3 depicts circuit 300 for controlling a test POR input 302 using fuse 322 according to one embodiment. Circuit 300 includes POR circuit 314 that generates signal PWR_POR 316, and logic AND gate 318 having output POR signal 320, with the same functionality as described with respect to FIG. 2. Circuit 300 includes test POR override circuitry 342 that controls TEST_POR input 302. Circuit 300 enables TEST_POR signal 302 to override PWR_POR signal 316 before fuse 322 is programmed, also referred to herein as "blown," and disables TEST_POR signal 302 once fuse 322 is programmed.

In one embodiment, fuse 322 is a polyfuse offering low resistance while intact (before being blown), and high resistance after being blown. In one embodiment, fuse 322 has a resistance of 0.1KΩ while intact and 3KΩ after being blown, but other values are also possible. In another embodiment, fuse 322 is an optical fuse. In yet another embodiment, fuse 322 is a resettable fuse, such as a PolySwitch. Other types of fuses can also be used with embodiments of the invention as long as they conform to the functionality described herein.

Fuse control circuitry 332 controls the operation of fuse 322 and provides status information regarding fuse 322. Once transistor 324 is turned on by fuse control circuitry 332, fuse 322 will be in electrical communication between a power supply and ground, causing a high current that programs (blows) the fuse to a second state (i.e. going from 0.1KΩ to 3KΩ). The depicted configuration of fuse control circuitry 332 is not meant to be limiting, as other circuitry designed to program fuse 322 can be used with embodiments of the invention.

During normal operation, e.g., anytime except when the fuse is being programmed, fuse 322 and resistor 326 are connected serially to form a voltage divider at point AA. In one embodiment, resistor 326 has a value of 1KΩ, but other values are also possible. When the fuse is intact (low resistance), point AA has a logic value of high, and when the fuse is blown (high resistance), point AA has a logic value of low.

AA is connected via inverters 328 and 330 to point BB, thus BB has the same logic value of AA. TEST_POR input 302 is connected through inverters 304 and 306 to pass gate 308. If pass gate 308 is turned on, then T_POR signal 312 will be equal to TEST_POR 302. In one embodiment, pass gate 308 includes a CMOS pass gate, however, this is not meant to be limiting. When BB has a logic value of high, transistor 310 is turned off and pass gate 308 is turned on. Thus, T_POR 312 will be equal to TEST_POR 302 when point BB has a logic value of high. When BB has a logic value of low, pass gate 308 is turned off and PMOS transistor 310 is turned on, forcing T_POR 312 to a logic high value. It should be noted that inverter 304 is needed to prevent a TEST_POR negative voltage to turn on pass gate 308 and inverter 306 is needed to maintain TEST_POR polarity.

In summary, when fuse 322 is intact AA has a logic value of high, BB has a logic value of high, pass gate 308 is turned on, transistor 310 is turned off, and T_POR 312 is equal to TEST_POR 302. When fuse 322 is blown, AA is logic low, BB is logic low, pass gate 308 is turned off and transistor 310 is turned on, T_POR 312 is logic high, and POR 320 is equal to PWR_POR.

In a typical manufacturing environment, a one time programmable fuse is blown only after all testing on the IC is complete and before shipment of the IC to customers, thus disabling TEST_POR functionality except for factory testing. Circuit 300 is robust because of the simplicity of the circuit and because circuit 300 depends on one inverter that causes circuit 300 to be operational before other circuits in the IC, including the POR circuitry. In other applications, the fuse is resettable and once the resettable fuse is programmed, TEST_POR functionality will be disabled. Once the resettable fuse is reset, TEST_POR functionality will be restored until the fuse is programmed again. In one application, the fuse is reset when the IC is powered off and when the IC is powered on again, the resettable fuse is "intact," enabling the functionality of TEST_POR in the IC until the resettable fuse is "blown" again.

In another embodiment (not shown), fuse 322 is powered by a power supply with a higher voltage than Vcc 340 and fuse 322 can be blown quicker or with a smaller pull down transistor 324. Inverter 328 is powered by the same power supply as fuse 322 and the output of inverter 328 is still determined as described below with respect to FIG. 4. Fuse control circuitry 332 is adapted to operate with the higher voltage supply to fuse 324 and with the higher voltage at point AA. The rest of circuit 300 can be powered by Vcc. Stepping down from a higher power supply inverter INV2 328 to a lower power supply at inverter INV 330 does not require a down level shifter.

Figure 4:
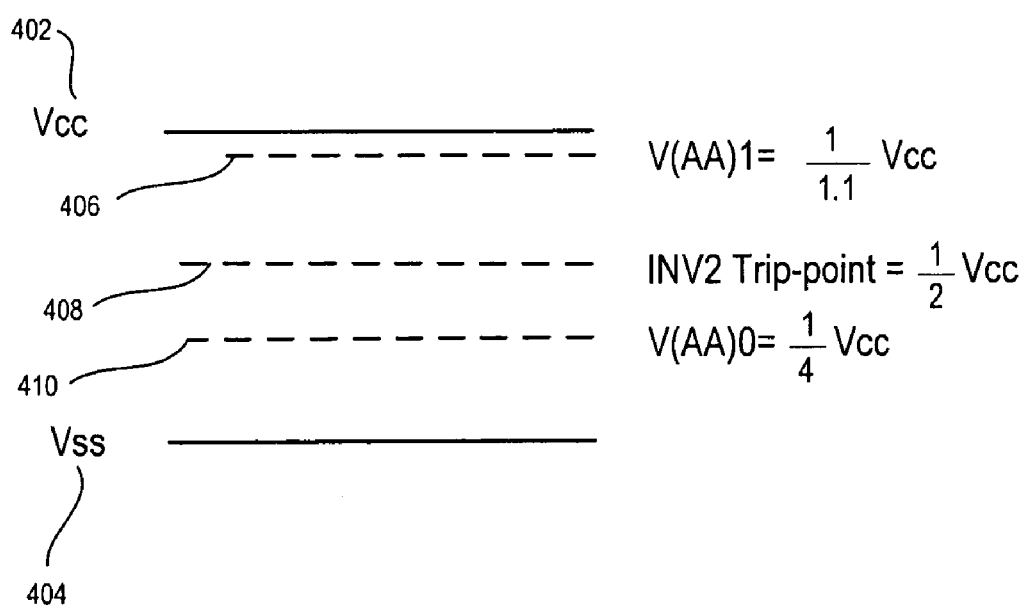
FIG. 4 shows voltage levels in the circuit of FIG. 3 for different states of the fuse, in accordance with one embodiment.

FIG. 4 shows voltage levels in the circuit of FIG. 3 for different states of the fuse, in accordance with one embodiment. $V_{cc}$ 402 and $V_{ss}$ 404 represent voltages for logic values of high and low. Assuming $V_{ss}$ has a value of 0 volts, voltage V(AA) at point AA (see FIG. 3) is calculated by the following equation:

$$V_{AA} = \frac{RPD}{RPD + RFUSE} V_{cc} \qquad (1)$$

RPD represents the resistance of resistor 326 and RFUSE represents the resistance of fuse 322. In one embodiment where RFUSE can be 0.1KΩ or 3KΩ, and where RPD is 1KΩ, V(AA)1 406 is $0.9V_{cc}$ when fuse 322 is intact, and V(AA)0 410 is $0.25V_{cc}$ when fuse 322 is blown. Trip point 408 defines the voltage level boundary to assign a logic value. In one embodiment, trip point 408 is the mid point between $V_{cc}$ 402 and $V_{ss}$ 404, but other values are also possible.

V(AA)1 does not vary much across Process, Voltage and Temperature (PVT) variations since the resistance of the intact fuse RPD is very low compare to the resistance of RPD. V(AA)0 is always less than trip point 408 as long as the RFUSE of the blown fuse is bigger than 2*RPD. The lower the value of RPD and the higher the RFUSE of the blown fuse, the higher the functional margin is. The $I_{cc\_standby}$ current through the blown fuse is calculated by the following formula:

$$I_{cc\_standby} = \frac{V_{cc}}{RPD + RFUSE(BLOWN)} \qquad (2)$$

$I_{cc\_standby}$ is in the range of 620 μA in one embodiment.

Figure 5:
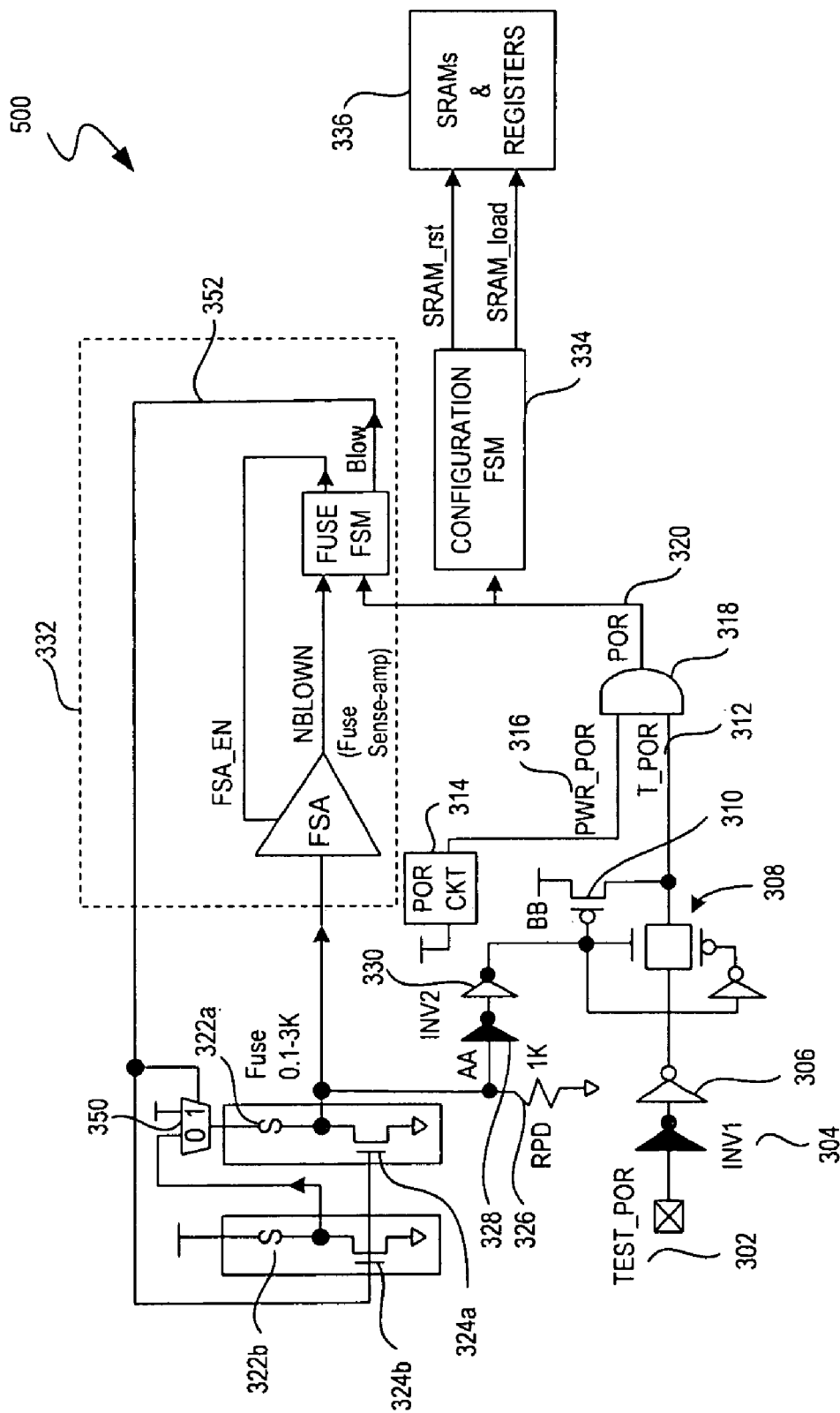
FIG. 5 depicts a circuit for controlling POR signals and including cascaded fuses to lower power consumption according to one embodiment.

FIG. 5 depicts circuit 500 for controlling POR signals and including cascaded fuses to lower power consumption according to one embodiment. Circuit 500 includes fuses 322a and 322b that are programmed (blown) by the same signal. Multiplexer 350 is controlled by Blow signal 352 generated by fuse control circuitry 332. When Blow signal 352 has a logic value of high, multiplexer 350 connects fuse 322a to a high voltage causing fuse 322a to be programmed because Blow signal 352 also turns on transistors 324a and 324b.

When the Blow signal is logic low, multiplexer 350 connects one terminal of fuse 322b with a terminal from fuse 322a, thereby connecting both fuses serially. $I_{cc\_standby}$ decreases because the resistance has increased due to the additional fuse. For the circuit with the values described above with respect to FIG. 4, V(AA)1 is $0.83V_{cc}$, and V(AA)0 is $0.14V_{cc}$. This increases the functional margin and lowers $I_{cc\_standby}$ to about 360 μA.

The concept of cascaded fuses can be expanded to connect more than two fuses serially. When cascading N fuses serially, the value of V(AA) and $I_{cc\_standby}$ are calculated by the following formulas:

$$V_{AA} = \frac{RPD}{RPD + N*RFUSE} V_{cc} \qquad (3)$$

$$I_{cc\_standby} = \frac{V_{cc}}{RPD + N*RFUSE(BLOWN)} \qquad (4)$$

The more fuses are cascaded together, the lower V(AA)1 and V(AA)0 are with respect to $V_{cc}$. In one embodiment, N has a range between 4 and 9, but other values are also possible. In yet another embodiment, fuse 322a, fuse 322b, mux 350, and inverter INV2 328 are powered by a separate power supply with a higher voltage than Vcc while the rest of circuit 500 can be powered by Vcc, as discussed previously with respect to FIG. 3.

Figure 6A:
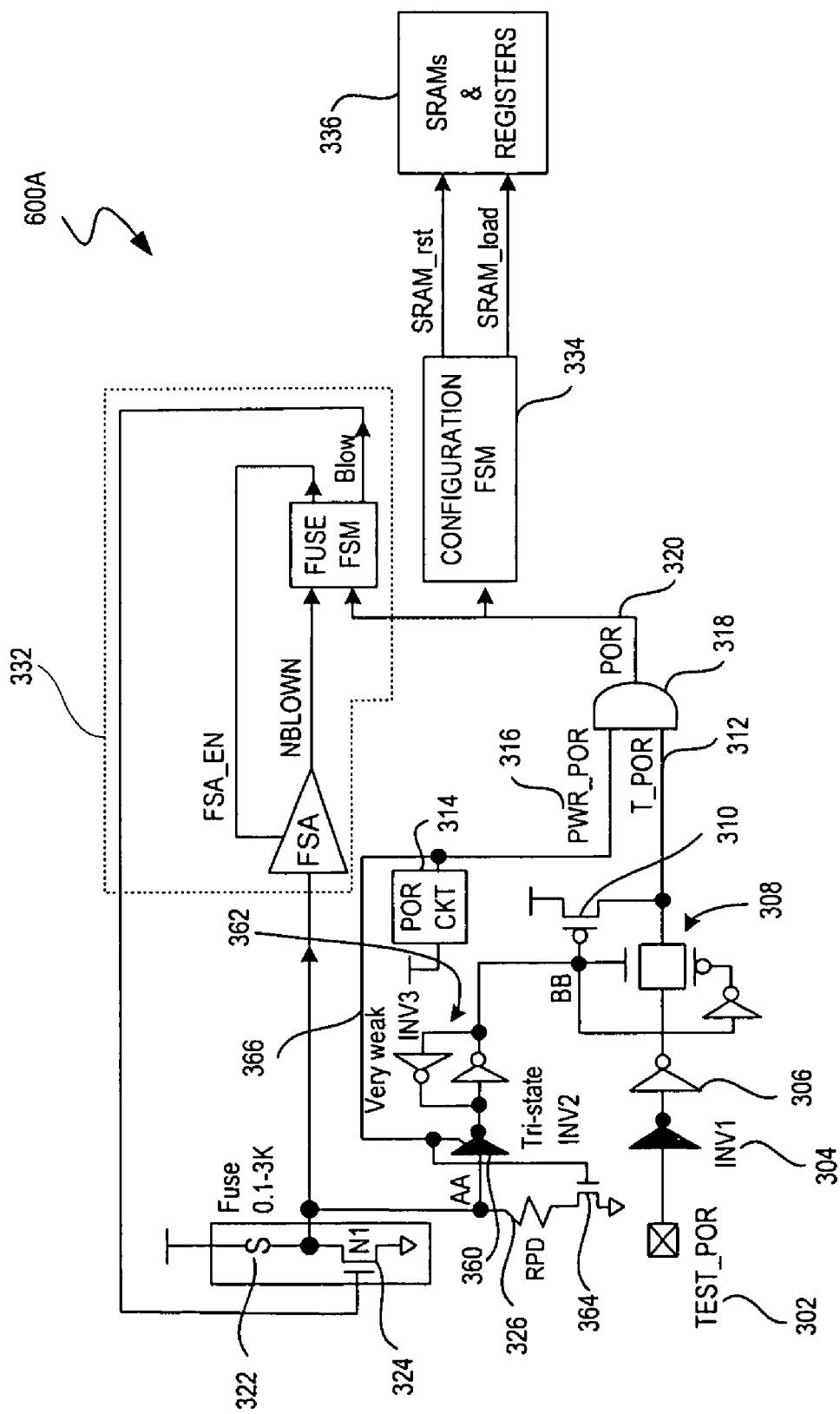
FIGS. 6A-6C depict several embodiments of circuitry to control POR signals while lowering power consumption.
Figure 6B:
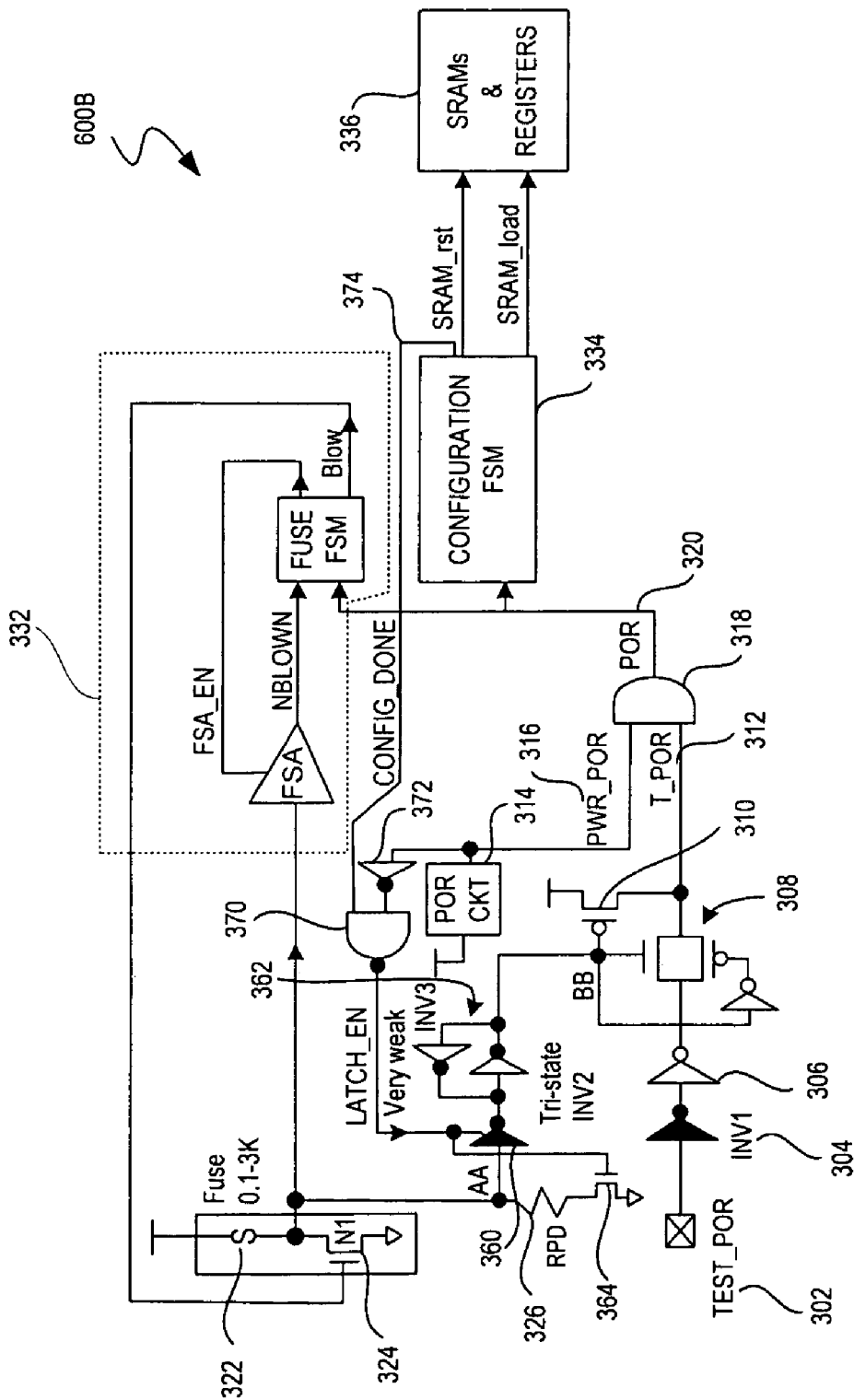
Figure 6C:
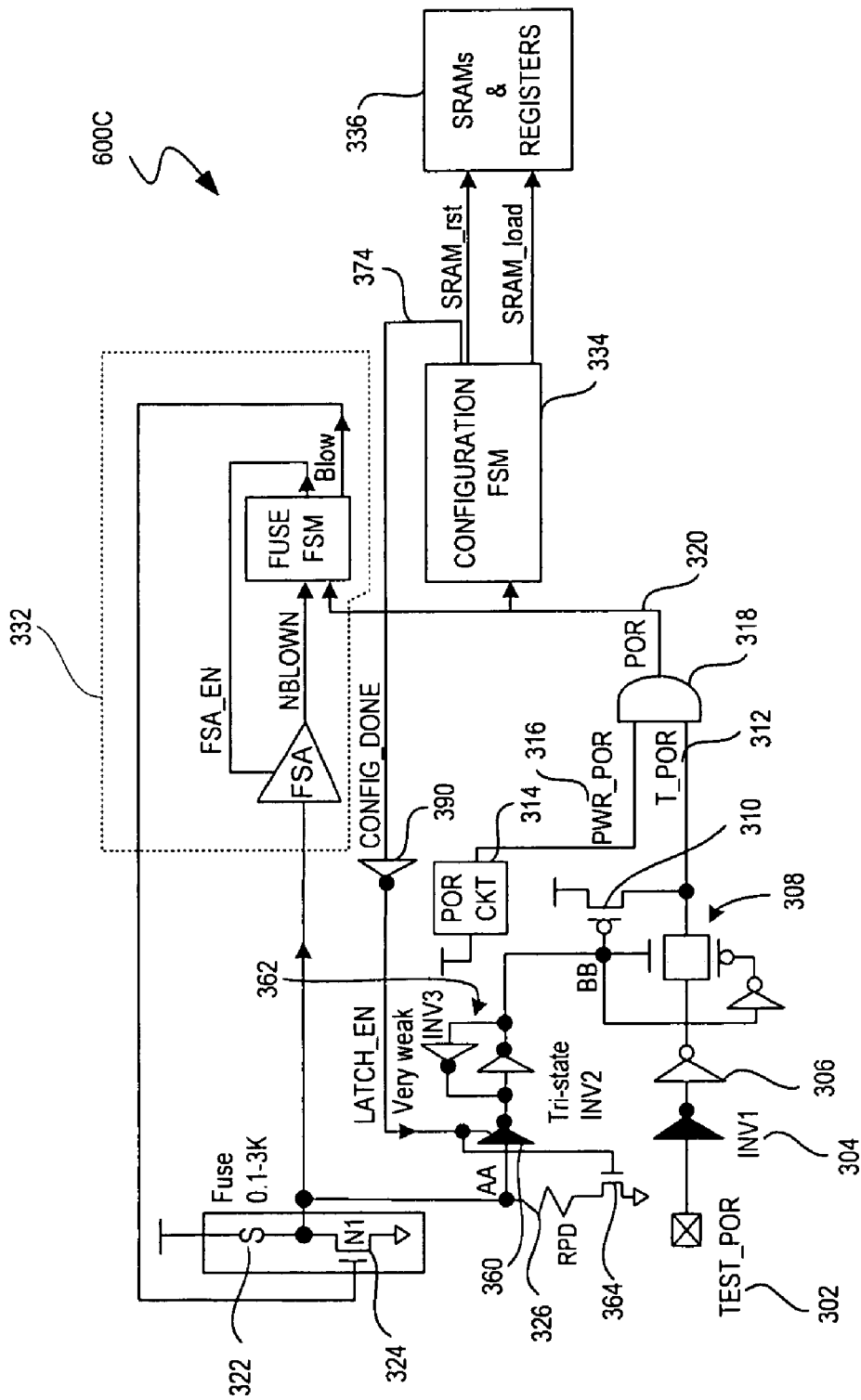

FIGS. 6A-6C depict several embodiments of circuitry to control POR signals while lowering power consumption. FIG. 6A shows circuit 600A that eliminates $I_{cc\_standby}$ by isolating resistor RPD 326 in standby mode. Points AA and BB of circuit 600A are connected by tri-state buffer 360 and latch 362. Latch 362 includes two inverters with their terminals interconnected. As a result, output of latch 362 has a logic value opposite of the input of latch 362. It should be appreciated that latch 362 illustrated in FIGS. 6A-C is exemplary. Other embodiments may utilize different latches. The embodiments illustrated in FIGS. 6A-C should therefore not be interpreted to be exclusive or limiting, but rather exemplary or illustrative.

Tri-state buffer 360 is controlled by PWR_POR signal 316 via connection 366. When PWR_POR is at logic high, tri-state buffer 360 is enabled and transistor 364 is turned on, causing the voltage at point AA to be set as previously described with respect to FIG. 3. Because tri-state buffer 360 is enabled, an inverted value of V(AA) is loaded in latch 362. The output of latch 362 in the opposite of its input, therefore output of latch 362 is equal to the value of V(AA) when the latch was loaded.

When PWR_POR 316 is logic low, tri-state buffer 360 is disabled causing latch 362 to hold its contents until a new POR sequence is started. Additionally, transistor 364 will be turned off by PWR_POR 316 causing the isolation of fuse 322 and resistor 326, resulting in a $I_{cc\_standby}$ of approximately 0 Amps. In another embodiment, RPD can have a low value (i.e. less than 1KΩ) because RPD is isolated during normal operation of the IC.

In another embodiment, a one-shot pulse generator is included along connection 366 to extend the time to load the latch. Pulse-width variations due to PVT do not impact the performance of circuit 600A because a typical POR pulse is in the order of milliseconds, while the latch needs only nanoseconds to load.

FIG. 6B shows circuit 600B that eliminates $I_{cc\_standby}$ and enables the loading of latch 362 based on PWR_POR 316 and the end of the configuration phase of the IC. Configuration Finite State Machine (FSM) 374 outputs CONFIG_DONE signal 374 that becomes logic high once the configuration phase is complete. NAND gate 370 has CONFIG_DONE 374 and the inverse of PWR_POR 316 as inputs. The LATCH_EN output of NAND gate 370 controls tri-state buffer 360.

Circuit 600B offers redundant controls for the loading of the latch by enabling the loading during power up (PWR_POR) or before the configuration phase is complete (CONFIG_DONE). Once the configuration phase is done (CONFIG_DONE has logic value of high) LATCH_EN will only enable the loading of the latch when a POR signal is detected.

FIG. 6C depicts circuit 600C where the latch loading depends only on CONFIG_DONE signal 374. LATCH_EN is the opposite of CONFIG_DONE 374 because of inverter 390. During the initialization phase, CONFIG_DONE has a logic value of low, thus LATCH_EN has a logic value of high that enables the loading of the latch. Once the configuration phase is over, CONFIG_DONE becomes logic high, and LATCH_EN will be set to logic low to disable the loading of the latch until a new configuration phase is started.

It should be noted that each of the circuits in FIGS. 6A-C are not discussed in detail as the functionality of some elements is described with respect to at least one of the circuits depicted in the Figures presented.

Figure 7:
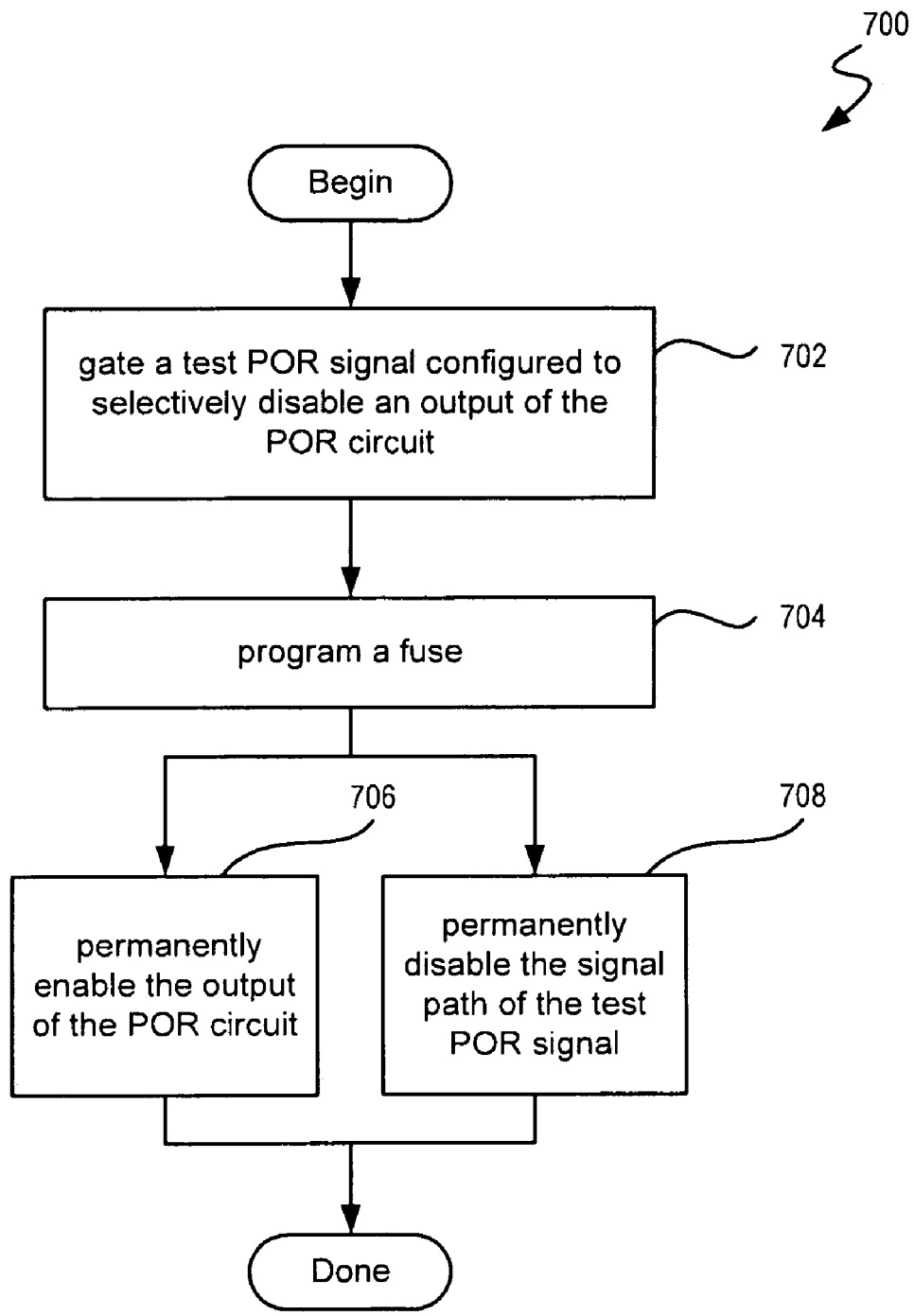
FIG. 7 shows the process flow for controlling a POR circuit in an Integrated Circuit in accordance with one embodiment of the invention.

FIG. 7 shows the process flow for controlling a POR circuit in an Integrated Circuit, in accordance with one embodiment of the invention. In operation 702, the method gates the test POR signal which is configured to selectively disable an output of the POR circuit. TEST_POR signals in the circuits shown in FIGS. 3, 5, and 6A-C are examples of test POR signals used to selectively disable the output of POR circuit 314. A fuse is programmed in operation 704, such as fuse 322 in the aforementioned figures. Before the fuse is programmed, one of the terminals of the fuse corresponds to a first logic value, and after the fuse is programmed the terminal of the fuse corresponds to a second logic value (see point AA in FIG. 3).

In another embodiment, a latch is loaded in operation 704 (see latch 362 in FIGS. 6A-C). The latch is configured to enable or disable a pass gate connected to the test POR signal. In some embodiments, the loading of the latch is controlled by the output of the POR circuit, or by a signal indicating that the configuration phase of the IC is complete, or by both the output of the POR circuit and the signal related to the configuration phase status (see signal controlling tri-state buffers in FIGS. 6A-C). In yet another embodiment, several cascaded fuses are used together (see fuses 322*a-b* in FIG. 5).

As a result of the programming of the fuse, operation 706 permanently disables the signal path of the test POR signal, and operation 708 permanently enables the output of the POR circuit. It should be noted, that operations 706 and 708 are shown to execute simultaneously, but they can also occur at different times. Operation 706 to permanently enable the output of the POR circuit is implemented in different embodiments as seen in FIGS. 3, 5, and 6A-C by pass gate 308 enabled by a logic value of high at point BB. Operation 708 to permanently enable the output of the POR circuit is implemented in some embodiments by PMOS transistor 310 gated by the Voltage at point BB making signal T_POR to a logic high value when transistor 310 is turned on.

The circuits and methods, for controlling a Power On Reset (POR) circuit in an Integrated Circuit (IC), described herein may be incorporated into any suitable integrated circuit. For example, the method and system may be incorporated into other types of programmable logic devices such as programmable array logic (PAL), programmable logic array (PLA), field-programmable gate array (FPGA), field programmable logic array (FPLA), electrically programmable logic devices (EPLD), electrically erasable programmable logic device (EEPLD), logic cell array (LCA), just to name a few. The programmable logic device may be a part of a data processing system that includes one or more of the following components: a processor, memory; I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A circuit for an Integrated Circuit (IC), the circuit comprising:
   a fuse;
   test POR override circuitry in electrical communication with the fuse, the test POR override circuitry including a latch, an output of the test POR override circuitry being selectable between a test POR signal and a first logic value based on an output of the latch; and latch enable circuitry in communication with the test POR override circuitry, the latch enable circuitry enabling loading the latch with the first logic value when the fuse has been programmed and with a second logic value otherwise;

wherein the output of the test POR override circuitry and an output of the POR circuit are gated to generate a POR signal.

2. The circuit of claim 1, wherein the test POR override circuitry further includes, a resistor in electrical communication with the fuse at a first terminal of the resistor, and a first transistor in electrical communication with a second terminal of the resistor, the first transistor causing the second logic value at the second terminal of the resistor when the first transistor is turned on, wherein the first terminal of the resistor has the second logic value when the fuse has been programmed and the first transistor is turned on, and has the first logic value when the fuse has not been programmed and the first transistor is turned on.

3. The circuit of claim 2, wherein the test POR override circuitry further includes, a tri-state buffer in electrical communication with the first terminal of the resistor and with the latch, the tri-state buffer being controlled by the latch enable circuitry.

4. The circuit of claim 3, wherein the fuse and the transistor form a voltage divider when loading the latch to produce a first voltage at the first terminal of the resistor, the first voltage being above a trip voltage of the tri-state buffer when the fuse has not been programmed, the first voltage being below the trip voltage when the fuse has been programmed.

5. The circuit of claim 2, wherein the latch enable circuitry is in electrical communication with the gate of the first transistor.

6. The circuit of claim 1, wherein the latch enable circuitry further includes an electrical connection between the output of the POR circuit and the test POR override circuitry.

7. The circuit of claim 1, wherein the latch enable circuitry enables loading the latch when one of the output of the POR circuit is the first logic value or a configuration phase of the IC is not complete.

8. The circuit of claim 1, wherein the IC is a Programmable Logic Device (PLD).

9. The circuit of claim 1, wherein the test POR override circuitry further includes, a second transistor having a gate in electrical communication with the output of the latch, the second transistor connecting the first logic value to the output of the test POR override circuitry when the second transistor is turned on, and a pass gate controlled by the output of the latch, the pass gate creating an electrical connection between the test POR signal and the output of the test POR override circuitry when the pass gate is turned on.

10. The circuit of claim 1, wherein the fuse is a polyfuse.

11. The circuit of claim 1, wherein the fuse is a one time programmable fuse.

12. A circuit for an Integrated Circuit (IC), the circuit comprising:

a fuse;

test POR override circuitry in electrical communication with the fuse, an output of the test POR override circuitry being selectable between a test POR signal and a first logic value based on a programming of the fuse; and a logic gate with the output of the test POR override circuitry and an output from a POR circuit as inputs, an output of the logic gate being a POR signal.

13. The circuit of claim 12, further including, a second fuse programmed at the same time as the fuse, and a multiplexer that connects the fuse to a power supply when the fuses are being programmed, the multiplexer establishing an electrical connection between the fuse and the second fuse when the fuses are not being programmed.

14. The circuit of claim 12, wherein the fuse is connected to a power supply, the fuse is programmed by activating a transistor that connects the fuse to ground.

15. The circuit of claim 12, wherein the test POR signal is in electrical communication with an inverter.

16. The circuit of claim 12, wherein the fuse is an optical fuse.

17. The circuit of claim 12, wherein the test POR signal is received from a pin of the IC.

18. The circuit of claim 12, wherein the fuse is a one time programmable fuse.

* * * * *